US012584970B2

(12) United States Patent
MacCleery et al.

(10) Patent No.: US 12,584,970 B2
(45) Date of Patent: Mar. 24, 2026

(54) ELECTRICAL METHODS FOR STRUCTURAL DEFECT DETECTION IN BATTERY CELLS

(71) Applicant: NATIONAL INSTRUMENTS CORPORATION, Austin, TX (US)

(72) Inventors: Brian Clifford MacCleery, Austin, TX (US); Martin Weiss, Austin, TX (US)

(73) Assignee: NATIONAL INSTRUMENTS CORPORATION, Austin, TX (US)

( * ) Notice: Subject to any disclaimer, the term of this patent is extended or adjusted under 35 U.S.C. 154(b) by 136 days.

(21) Appl. No.: 18/408,132

(22) Filed: Jan. 9, 2024

(65) Prior Publication Data

US 2024/0230779 A1 Jul. 11, 2024

Related U.S. Application Data

(60) Provisional application No. 63/479,172, filed on Jan. 9, 2023.

(51) Int. Cl.
*G01R 31/389* (2019.01)
*G01R 31/36* (2020.01)
*G01R 31/367* (2019.01)
*G01R 31/385* (2019.01)

(52) U.S. Cl.
CPC ....... *G01R 31/389* (2019.01); *G01R 31/3648* (2013.01); *G01R 31/367* (2019.01); *G01R 31/3865* (2019.01)

(58) Field of Classification Search
None
See application file for complete search history.

(56) References Cited

U.S. PATENT DOCUMENTS

| 5,493,199 A | 2/1996 | Koenck et al. |
| 5,856,737 A | 1/1999 | Miller et al. |
| 6,271,643 B1 | 8/2001 | Becker et al. |
| 9,465,077 B2 | 10/2016 | Love et al. |
| 11,623,526 B2 | 4/2023 | Stefanopoulou et al. |
| 2012/0133521 A1* | 5/2012 | Rothkopf ............... G01R 31/50 |
| | | 340/636.1 |

(Continued)

FOREIGN PATENT DOCUMENTS

| CN | 110687465 A | 1/2020 |
| CN | 111856284 A | 10/2020 |
| CN | 109856549 B | 7/2021 |

OTHER PUBLICATIONS

International Search Report and Written Opinion; International Application No. PCT/US2024/010896; mailed Apr. 19, 2024; 9 pgs.

(Continued)

*Primary Examiner* — Jas A Sanghera
(74) *Attorney, Agent, or Firm* — Kowert, Hood, Munyon, Rankin & Goetzel, P.C.; Jeffrey C. Hood; Luke Langsjoen

(57) ABSTRACT

Systems, methods, and devices for characterizing a defect of a device-under-test (DUT). A first measurement is performed of a first quantity on the DUT prior to performing a first operation on the DUT, producing a first result. The first operation is performed on the DUT, and subsequently a second measurement of the first quantity is performed on the DUT, producing a second result. A defect class is characterized for the DUT from a plurality of defect classes based on a difference between the first and second results.

20 Claims, 9 Drawing Sheets

(56)                    References Cited

U.S. PATENT DOCUMENTS

| | | | |
|---|---|---|---|
| 2012/0176140 A1 | 7/2012 | Kitsuani et al. | |
| 2012/0186071 A1 | 7/2012 | Yamashita et al. | |
| 2019/0036373 A1 | 1/2019 | Shimura | |
| 2020/0358147 A1 | 11/2020 | Dou et al. | |
| 2021/0190874 A1* | 6/2021 | Kim | H01M 10/482 |
| 2022/0404430 A1 | 12/2022 | Salvador et al. | |
| 2023/0038456 A1 | 2/2023 | Lee et al. | |
| 2024/0060934 A1* | 2/2024 | Park | G01R 31/392 |
| 2024/0142535 A1* | 5/2024 | Jeong | G01R 19/257 |

OTHER PUBLICATIONS

International Search Report and Written Opinion; International Application No. PCT/US2023/077195; mailed Jun. 28, 2024; 12 pgs.

* cited by examiner

Computer System 82

Configured with program instructions according to embodiments of the invention

Controller 202

To Formation and/or Aging Tower

*cell formation setup*

ELECTRICAL METHODS FOR STRUCTURAL DEFECT DETECTION IN BATTERY CELLS

PRIORITY INFORMATION

This application claims benefit of and priority to U.S. Provisional Application No. 63/479,172, titled "Electrical Methods for Structural Defect Detection in Battery Cells" and filed Jan. 9, 2023, which is hereby incorporated by reference in its entirety as though fully and completely set forth herein.

FIELD OF THE INVENTION

The present invention relates to the field of battery cell manufacturing and defect detection.

DESCRIPTION OF THE RELATED ART

A typical workflow for battery cell constructions involves cell manufacturing, formation, and aging. Yields in battery cell manufacturing processes are typically below 80% due to variability in the involved electrochemical processes, and this yield rate has been difficult to improve. In addition, formation and aging are time-consuming processes that take on the order of days to complete. Aging includes repeatedly taking cell measurements to detect defects, but defects may be difficult to detect and may present significant risk to product performance and safety. Current implementations to address these issues become cost prohibitive at scale. Battery cell factories employ equipment and infrastructure to cycle and age a massive number of cells, potentially millions at full capacity. Accordingly, improvements in the field, in particular regarding improvements in battery cell defect detection, are desired.

SUMMARY OF THE INVENTION

Various embodiments are presented herein of systems, methods and devices for characterizing a defect of a device-under-test (DUT). The DUT may be a battery cell, or another kind of DUT.

In some embodiments, a first measurement is performed of a first quantity on the DUT prior to performing a first operation on the DUT. Performing the first measurement produces a first result.

In some embodiments, the first operation is performed on the DUT;

In some embodiments, after performing the first operation on the DUT, a second measurement of the first quantity is performed on the DUT. Performing the second measurement produces a second result.

In some embodiments, a defect class is characterized for the DUT from a plurality of defect classes based at least in part on a difference between the first and second results. The plurality of defect classes may relate to defects in different regions of the DUT.

This Summary is intended to provide a brief overview of some of the subject matter described in this document. Accordingly, it will be appreciated that the above-described features are only examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

A better understanding of the present invention can be obtained when the following detailed description of the preferred embodiment is considered in conjunction with the following drawings, in which.

Figure 1:
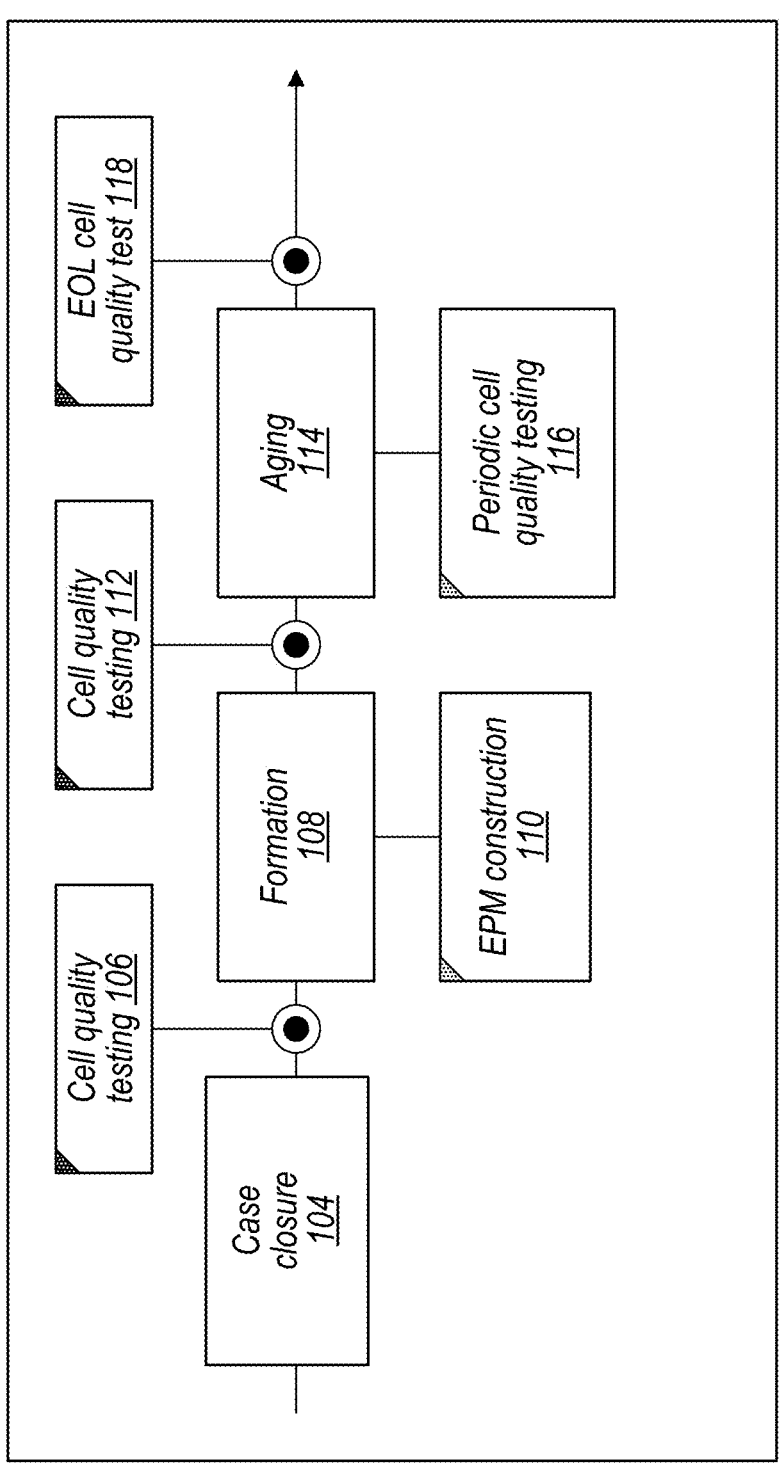
FIG. 1 illustrates a production workflow for battery cells, according to some embodiments.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Acronyms

The following is a listing of the acronyms used in the present application:

EPM: Electrochemical Process Manifold

DUT: Device Under Test

SUT: System Under Test

AC: Alternating Current

IGBT: Insulated Gate Bipolar Transistor

ADC: Analog-to-Digital Converter

PLD: Programmable Logic Device

FPGA: Field Programmable Gate Array

TX/RX: Transmit/Receive

CLK: Clock

LED: Light-Emitting Diode

BCI: Battery Cell Interface

BCF: Battery Cell Fixture

PDU: Power Distribution Unit

Terms

The following is a glossary of terms used in the present application:

Memory Medium—Any of various types of non-transitory computer accessible memory devices or storage devices. The term "memory medium" is intended to include an installation medium, e.g., a CD-ROM, floppy disks 104, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may comprise other types of non-transitory memory as well or combinations thereof. In addition, the memory medium may be located in a first computer in which the programs are executed, or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices comprising multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic."

Processing Element—refers to various elements or combinations of elements that are capable of performing a function in a device, such as a user equipment or a cellular network device. Processing elements may include, for example: processors and associated memory, portions or circuits of individual processor cores, entire processor cores, processor arrays, circuits such as an ASIC (Application Specific Integrated Circuit), programmable hardware elements such as a field programmable gate array (FPGA), as well any of various combinations of the above.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner. Note that various embodiments described herein may be implemented by a computer or software program. A software program may be stored as program instructions on a memory medium.

Hardware Configuration Program—a program, e.g., a netlist or bit file, that can be used to program or configure a programmable hardware element.

Program—the term "program" is intended to have the full breadth of its ordinary meaning. The term "program" includes 1) a software program which may be stored in a memory and is executable by a processor or 2) a hardware configuration program useable for configuring a programmable hardware element.

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Measurement Device—includes instruments, data acquisition devices, smart sensors, and any of various types of devices that are configured to acquire and/or store data. A measurement device may also optionally be further configured to analyze or process the acquired or stored data. A measurement device may also optionally be further configured as a signal generator to generate signals for provision to a device-under-test. Examples of a measurement device include an instrument, such as a traditional stand-alone "box" instrument, a computer-based instrument (instrument on a card) or external instrument, a data acquisition card, a device external to a computer that operates similarly to a data acquisition card, a smart sensor, one or more DAQ or measurement cards or modules in a chassis, an image acquisition device, such as an image acquisition (or machine vision) card (also called a video capture board) or smart camera, a motion control device, a robot having machine vision, a signal generator, and other similar types of devices. Exemplary "stand-alone" instruments include oscilloscopes, multimeters, signal analyzers, arbitrary waveform generators, spectroscopes, and similar measurement, test, or automation instruments.

A measurement device may be further configured to perform control functions, e.g., in response to analysis of the acquired or stored data. For example, the measurement device may send a control signal to an external system, such as a motion control system or to a sensor, in response to particular data. A measurement device may also be configured to perform automation functions, i.e., may receive and analyze data, and issue automation control signals in response.

Functional Unit (or Processing Element)—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors, as well as any combinations thereof.

Wireless—refers to a communications, monitoring, or control system in which electromagnetic or acoustic waves carry a signal through space rather than along a wire.

Approximately—refers to a value being within some specified tolerance or acceptable margin of error or uncertainty of a target value, where the specific tolerance or margin is generally dependent on the application. Thus, for example, in various applications or embodiments, the term approximately may mean: within. 1% of the target value, within 0.2% of the target value, within 0.5% of the target value, within 1%, 2%, 5%, or 10% of the target value, and so forth, as required by the particular application of the present techniques.

SUT Interface—one or more antenna probes and potentially supporting parts modifying the collective properties the antenna probes and parts are presenting to the electromagnetic radiation associated with wireless signals and giving structural integrity to their assembly, and which may be used to measure the wireless signals generated by the SUT.

FIG. 1—Battery Cell Manufacturing Workflow

FIG. 1 is a workflow diagram illustrating a method for manufacturing battery cells, according to some embodiments. At 104, after physically constructing the components of a battery cell, the case closure is performed to contain the battery components. At 106, the quality of the cell is tested prior to the formation process. At 108, a cell formation process is performed where the cell is repeatedly charged and discharged to establish a stable voltage difference across the anode and cathode. An electrochemical process manifold (EPM) may be constructed 110 during the formation process. Some embodiments herein perform measurements and operations on the cell during charging and/or discharging to characterize a defect class for the cell, assist in cell diagnostics and to improve the cell formation process.

After an electrochemical cell is assembled, its chemical structure is changed in order to become ready to use as an energy storage element. This may be done by forcing an electric current from one of the electrodes to the other, whereby an electric potential is developed across the electrodes. Whereas this process generally involves a positive net supply of energy to the cell ('charging'), the process generally also includes periods of time where the net supply of energy is negative ('discharging'). After a programmed sequence of current, which generally depends on the cell voltage, temperature, stored or dissipated energy, and/or time, has been applied to the cell, its production is considered complete. The production of each cell typically takes a different amount of time, mainly due to production process variations of the cell's components.

The quality of the cell may be determined through testing after completion of the formation process at step 112. The rejection rate after completing cell formation may be as high as 20%, where only 80% of the formed cells are of sufficiently high quality to proceed to aging and deployment. This may be because, during production, a considerable number of cells exhibit deviations on e.g., their temperature, terminal voltage, or another physical property. If the deviation exceeds a specified quality threshold, the production is said to have failed. Failed cells preferably are removed as early as possible from the production process, to be replaced by another cell to initiate production. Embodiments herein identify a defect class for a defective cell dynamically during the cell formation process to improve battery yields.

At 114, the cells that have completed the formation process and satisfied cell quality testing are moved to an aging tower to stabilize the chemical composition of the cells. The same measurement and control circuitry used in the formation process may be repurposed to periodically test cell quality during the aging process at step 116, whereby defective cells may be identified and addressed, and the cell fixture may be repurposed for a new cell. Finally, at 118 an end of line (EOL) cell quality test is performed on the aged cells prior to deploying them to market.

Figure 2:
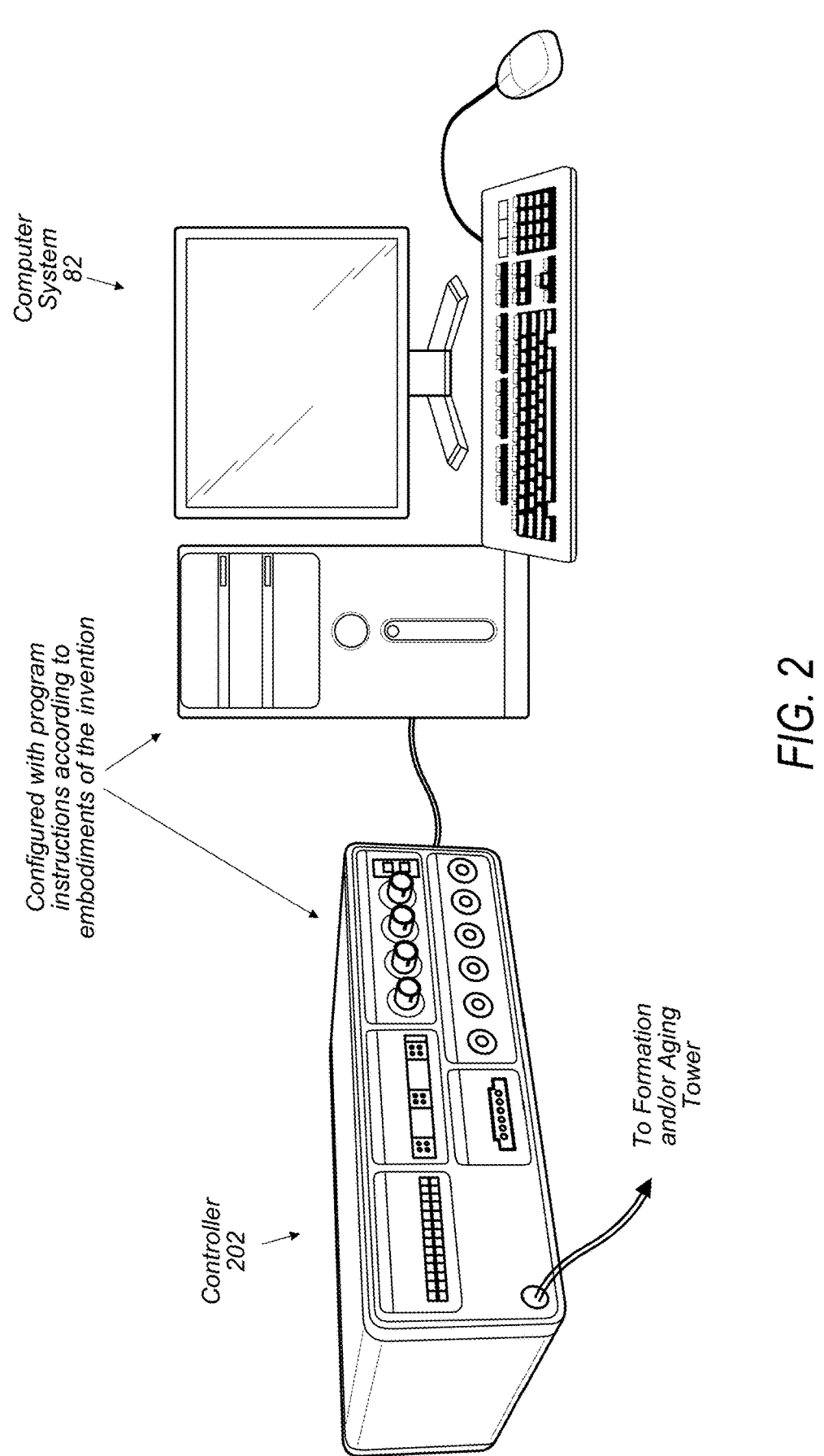
FIG. 2 shows a computer system coupled to a controller, according to some embodiments.

FIG. 2—Computer System and Controller

FIG. 2 is a system diagram illustrating a computer system 82 coupled to a controller 202, according to some embodiments. The controller may be coupled via a wired or wireless connection to a formation tower and/or an aging tower, and may be configured to receive information from the formation and/or aging towers during a cell manufacturing process and provide instructions to modify parameters of the manufacturing process. For example, the controller may receive information from measurement and control circuitry that is monitoring a particular battery cell within a battery cell fixture during cell formation, and in response to this information the controller may characterize a defect class for a defective cell. This may include constructing an EPM, displaying the EPM on a display, and/or providing instructions to modify the formation process on the particular battery cell or another battery cell. Additionally or alternatively, the controller may perform analytics on the EPM (e.g., characterizing defects in the cell), and display the analytics along with the EPM on a display device, whereby a user may determine whether to modify the manufacturing process based on the displayed information. In some embodiments, the controller may be executed from the computer system 82 (i.e., the controller may be part of the computer system rather than a separate device).

Advantageously, information provided by the controller during the manufacturing process may enable a user to dynamically intervene in the manufacturing to improve overall yield and efficiency. For example, defective cells may be identified earlier in the manufacturing process (e.g., during the formation process or during the aging process), the defective cells may be removed from the manufacturing process for repair or disposal, and the battery cell fixtures housing the defective cells may be repurposed for the manufacture of new battery cells.

Figure 3:
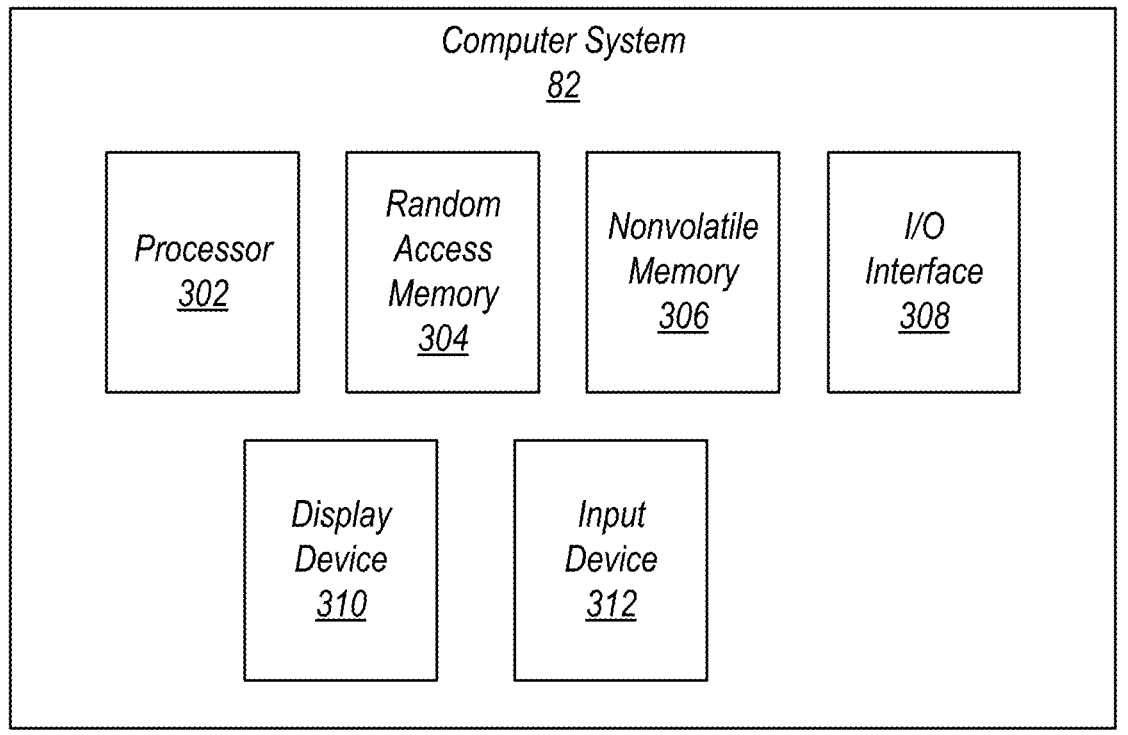
FIG. 3 is a basic computer system block diagram, according to some embodiments.

FIG. 3—Computer System Block Diagram

FIG. 3 illustrates a simplified block diagram of the computer system 82. As shown, the computer system 82 may comprise a processor 302 that is coupled to a random-access memory (RAM) 304 and a nonvolatile memory 306 to implement embodiments described herein. For example, the processor may execute program instructions stored on the nonvolatile memory to control and/or receive information from a cell formation and/or aging tower. The computer system 82 may also comprise an input device 312 for receiving user input (e.g., a keyboard, mouse, touchpad, etc.) and a display device 310 for presenting output on a display. The computer 82 may also comprise an Input/Output (I/O) interface 308 that is coupled to the controller 202 or directly to a cell tower to provide output/instructions to control cell formation and receive input and/or information related to individual cells.

Battery Cell Defect Detection

Embodiments herein address problems and difficulties associated with the manufacturing of battery cells, which may be composed of a variety of materials such as metal foils, polymers, liquids, and gasses. In particular, in some embodiments, battery cells are tested during a manufacturing process and various classes and specific types of structural defects are identified, differentiated, and related back to electrical measurements and derived values.

In some embodiments, systems and methods are described that relate or map between the electrical domain and the structural domain in battery cells. Electrical stimuli and response may be mapped to the battery structure in order to detect and diagnose structural defects. In some embodiments, various methods are introduced to diagnose specific structural defects in batteries using electrical stimuli and response. These methods may be combined with electro-thermal methods that enable controlled regional heating in the battery cell. The electrical response may be mapped to the heat response in various regions of the cell, which enables production of controlled thermal gradients within limits. The applied heat may be mapped to the expansion and contraction of the mechanical structures in the various regions. In some embodiments, the resulting force vectors, applied to certain regions of the cell, may be used to exacerbate or improve specific defect modes (e.g., a torn tab or other defect). The difference when exacerbated or improved may then be measured in order to assess the specific defect mode. In this manner, individual structural defects may be diagnosed independently.

In some embodiments, problems are addressed related to electrochemical processes in battery cells and their relations to physical domains such as electrothermal processes, elec-tromechanical processes, and electro-structural processes. Advantageously, the cell formation process may be improved by regionally controlling the rate of chemical processes in various regions of the cell, among other pos-sibilities.

Defect types (i.e., defect classes) addressed by embodi-ments described herein may include but are not limited to: internal shorts such as a torn tab, a torn separator, a folded separator, dendrites, or internal contamination; or welds such as a bad tab weld or a bad fuse weld. Battery regions diagnosed by embodiments herein may include, but are not limited to: thin metallic foil sheets (anode and cathode), graphite slurry coating, polymer separator, vacuum bag, liquid electrolyte, tabs or gases, among other possibilities.

Some embodiments herein utilize controlled regional heating to detect defects, whereas other embodiments per-form defect detection without controlled regional heating.

Defect Detection Without Controlled Heating

For embodiments that do not utilize controlled regional heating effects, measured electrical signals and related analysis values may be compared at multiple stages of battery manufacturing. This may include but is not limited to the welding station, bagging station, electrolyte filling sta-tion, post-formation pre-degassing, post-formation degas-sing station, and post-aging degassing station, among other possibilities.

At each manufacturing step, and between manufacturing steps, data acquisition and analysis may be performed in order to detect classes of battery structural defects and specific structural defects. Examples of analysis values derived from measurement signals may include but are not limited to impedance (Z), admittance (Y), inductance using a series-equivalent circuit model ($L_s$), capacitance using a series-equivalent circuit model ($C_s$), resistance using a series-equivalent circuit model ($R_s$), inductance using a parallel-equivalent circuit model ($L_p$), capacitance using a parallel-equivalent circuit model ($C_p$), resistance using a parallel-equivalent circuit model ($R_p$), a dissipation factor (D), a quality factor (Q), a DC voltage measurement ($V_{DC}$), a DC current measurement ($I_{DC}$), an AC voltage magnitude and phase angle, and an AC current magnitude and phase angle, among other possibilities.

In some embodiments, defect level diagnosis may be performed based on rules that relate the acquired signals and derived analysis values with classes of defects as well as specific defect modes, and the degree of severity of the defects. For example, identified electromagnetic responses may be related to specific structural defects. These relations may be derived from logical combinations of measured values and derived values, or alternatively more complex machine learning-based rules may be used for determining classes of structural defects, specific defects, and assessing confidence levels for the classifications.

In some embodiments, mechanical manipulation (e.g., via an actuator or fixture) may be used in combination with the acquisition of signals and derived analysis values to facili-tate the classification of defects. For example, methods that do not make use of controlled regional heating effects may still be combined with mechanical actuation (e.g., the regional application of forces or movement of structural elements such as the battery tabs) to probe various failure and defect modes.

Defect Detection With Controlled Heating

In some embodiments, controlled regional heating is utilized during the defect detection process. This may involve various methods for spatiotemporal controlled induction of heat gradients, electromechanical stress and strain gradients, and electrochemical process reaction rate gradients in a mixed media structure such as a battery cell.

Controlled regional heating may be used to unravel the non-linear relationships between the Electro-Magnetic, Electro-Thermal, Electro-Mechanical, Electro-Structural, and Electro-Chemical Process Manifolds and their complex relationships in a battery cell. Controlled regional heating may enable sampling of the state-space so as to collect a rich dataset spanning multiple domains across which energy is converted in a conservative manner. Advantageously, this may facilitate tracking of energy flows for electrical energy, magnetic energy, thermal energy, mechanical forces, stresses, strains, location and movement of structures, chemical processes, and/or gas production, among other possibilities.

Inducing regional heating may be used to produce stress and strain vectors directionally and regionally to exacerbate or reduce specific classes and types of structural defects, and/or to control the rate of chemical reactions through the use of thermal gradients in a variety of axes and to varying degrees based on the material properties, skin effects, hys-teresis and eddy current loss distributions. This may include standing wave and more advanced machine learning-based spatiotemporal distributions of chemical activation rates. For example, controlling the regional and/or spatio-temporal distribution of heating in a battery cell may cause regional differences in the mechanical expansion and contraction of the various materials contained in the battery cells, including but not limited to the thin metallic foils, graphite slurry coatings, polymer separators, liquid electrolytes, vacuum bag materials, thicker metallic tabs, and so on. The resulting stresses and strains may be oriented to exert mechanical forces between these components and thereby intentionally exacerbate a defect mode or modes of interest with discrimi-nation.

In some embodiments, the incompressible nature of liq-uids, metals and other materials (in contrast to the elastic behavior of gasses) in the battery cell may be utilized to ascertain the level of wetting of the graphite layers, as one example.

In some embodiments, region-specific heating of a cell is used to control the rate of electrochemical activity during cell formation in a spatial and regional way within the cell. Advantageously, the rate of the chemical reactions in the cell, relative to the ambient rate of chemical reactions in the cell, may be controlled with spatial precision. Since cell formation is a multistep process, this may be used to increase the uniformity of the progress of the multistep chemical processes across the cell by speeding up the regions that lag behind the mean process step, and thereby enabling a more spatially and temporally evenly distributed approach to cell formation, with benefits in terms of decreased formation time and better process yields.

Figure 4:
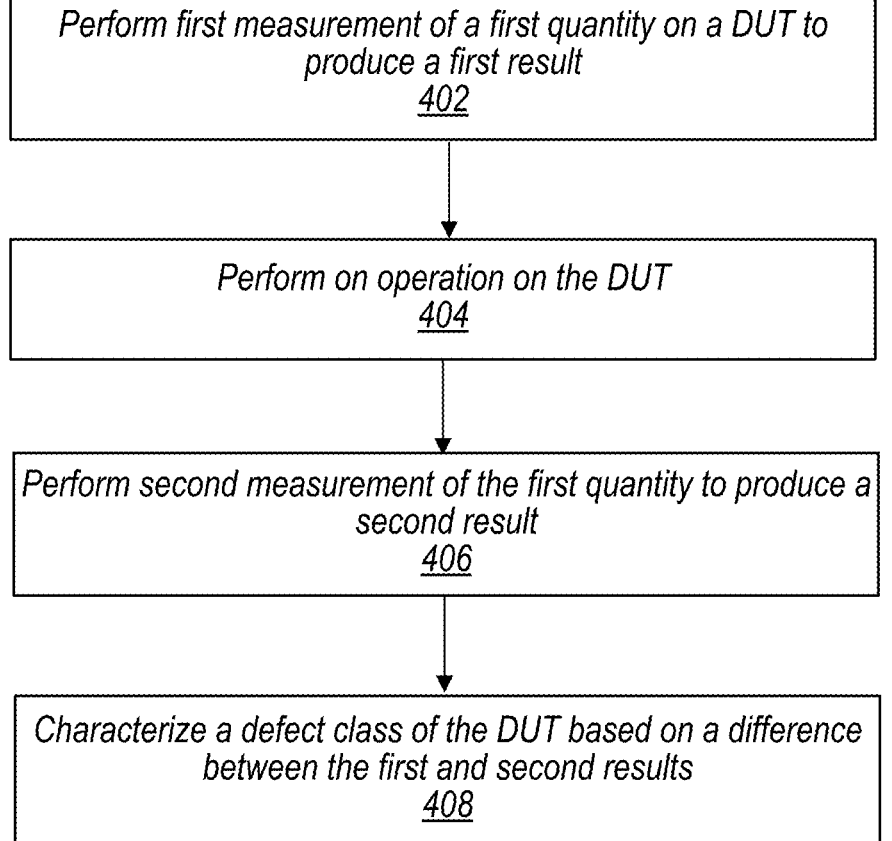
FIG. 4 is a flowchart diagram illustrating a method for characterizing a defect class for a device-under-test (DUT), according to some embodiments.

FIG. 4—Flowchart for Constructing an Electrochemical Process Manifold with Controlled Current FIG. 4 is a flowchart diagram illustrating a method for characterizing a defect of a device-under-test (DUT), according to some embodiments. The method shown in FIG. 4 may be used in conjunction with any of the computer systems, battery cells, memory media or devices shown in the above Figures, among other devices.

In some embodiments, the described method may be performed during a cell formation process of a battery cell. The cell may be of any of a variety of types of battery cells, and may be composed of materials including but not limited to lithium, sodium-ions, lithium-sulfur, lithium-air, lithium-oxygen, lithium-metal, metal-flouride, carbon nanotubes, carbon nanowires, nickel cadmium (NiCd), nickel metal hydride (NiMH), lead acid, lithium cobalt oxide (LiCoO2), lithium iron phosphate (LiFePO4), lithium nickel manganese cobalt oxide (LiNiMnCoO2), lithium manganese oxide (LiMn2O4), lithium titanate (Li2TiO3), or an organic compound.

In some embodiments, a computer system may include a processor and memory, and the memory may store program instructions executable by the processor to perform the method elements described in reference to FIG. 4. In various embodiments, the processor may be a parallel multi-processor system, a field programmable gate array (FPGA), or an application specific integrated circuit (ASIC). In various embodiments, the described method steps may be directed by a combination of the controller processor (e.g., such as controller 202 in FIG. 2) that interfaces with the DUT, and one or more processors of the computer system 82 (e.g., the processor 302) that directs the controller. In various embodiments, some of the method elements shown may be performed concurrently, in a different order than shown, or may be omitted. Additional method elements may also be performed as desired. As shown, this method may operate as follows.

At 402, a first measurement of a first quantity is performed on the DUT to produce a first result. The first measurement may be performed prior to performing a first operation on the DUT. The first measurement may measure any of a variety of functional properties of the DUT, such as its reactive impedance, resistance, inductance, voltage, current, temperature response, etc. The first measurement may be taken while applying an oscillating or constant voltage to the DUT. The voltage may be applied at a particular frequency, for a sweep over a range of frequencies, or with a more complex waveform, in various embodiments. In some embodiments, the first result is analyzed to determine a first performance metric of the DUT. For example, the first performance metric may be determined based on a difference between the first result and an ideal or model result for the DUT.

At 404, the first operation is performed on the DUT. In various embodiments, the first operation may be a manufacturing step of the DUT, controlled regional heating of the DUT, a physical actuation of the DUT, and/or an electrical actuation of the DUT, among other possibilities.

For example, the first operation may be a mechanical stress acting on the DUT, potentially in a particular direction and/or applied at one or more specific locations on the DUT. The mechanical stress may probe one or more failure modes of the DUT, e.g., to detect the presence of a torn or worn tab.

In some embodiments, the first operation includes controlled regional heating of the DUT. Controlled regional heating may be used to probe targeted expansion and/or contraction of specific regions of the DUT. Additionally or alternatively, controlled regional heating may be used to exert regional control over rates of electrochemical processes occurring in the DUT. For example, certain regions of the DUT may be separately increased and/or decreased in their activation level for an electrochemical process via controlled regional heating. This may be used to improve cell formation procedures, by performing regional rate modification to accelerate the formation process.

In some embodiments the first operation includes inducing a current through the DUT, which may be direct current (DC) or alternating current (AC), and may have a sinusoidal time dependence, or may be a more complex function of time.

In some embodiments, the first operation includes a gassing and degassing procedure performed on the DUT. Gassing and/or degassing may be used to observe the migration of gas through the cell, and the response of the DUT may be observed as the DUT relaxes after gas pressure is reduced. This may elucidate mechanical defects, as the movement caused before and after degassing may be associated with the regions where the gas is collected and these are often regionally correlated with mechanical features.

Structural defects associated with degassing are highly correlated with pressure buildup and release, and the interface between the bag itself and the electrodes and separators. This includes viscous friction effects among other relevant mechanical structural phenomena.

At 406, after performing the first operation on the DUT, a second measurement of the first quantity is performed on the DUT. Performing the second measurement produces a second result. The second measurement may be taken while applying an oscillating or constant voltage to the DUT. The voltage may be applied at a particular frequency, for a sweep over a range of frequencies, or with a more complex waveform, in various embodiments. The second measurement may be of the same type as the first measurement, such that a difference between the two measurements may be computed.

As one example, the first operation may be battery tab welding. For example, the first measurement may be taken after the foils have been compressed but before they are welded, and the second measurement may be taken after the foils have been welded but before the compression pressure is released. In this example, the first and second measurements may measure the reactive impedance of the battery, as one example. The change in the reactance impedance before and after welding, alone or in combination with other acquired signals or derived analysis values, may then be used to determine whether the tabs indicate damage such as a tear. Advantageously, using the difference in reactive impedance before and after welding may prevent normal variations between the nominal reactive impedance of different DUTs from impacting the test results.

In some embodiments, the first and second measurements may be taken using the same analog-digital instrumentation, analysis hardware, and software, and may utilize the same cabling and fixturing over a relatively short time period. Advantageously, this may reduce discrepancies in the temperature of the analog-digital instrument and the cable routing between the two measurements. The impact of errors introduced by cabling, fixturing and changes in the temperature of the analog-digital instrument may thereby be reduced. In some embodiments, the second result is analyzed to determine a second performance metric of the DUT.

In some embodiments, the first and second measurements are determined based at least in part on a structure of the DUT. For example, a frequency range used for a sweep of applied voltage when performing the measurements may be selected based on a documented frequency response for a DUT with a particular structure.

At 408, a first defect class for the DUT is characterized based at least in part on a difference between the first and second results. The first defect class may be characterized from a plurality of defect classes. The plurality of defect classes may correspond to defects in different regions of the DUT. The different defect classes may include, but are not limited to, a weld defect, a bad tab weld, a torn tab, a folded separator, a dendrite, an internal short, internal contamination, and wetting.

In some embodiments, the first defect class may indicate a defect in a particular region of the DUT, and the first and second measurements may not be specific to the particular region. For example, the first and second measurements may measure an overall reactive impedance of the DUT during a frequency-sweep applied voltage, and the first defect class may indicate a defect at a particular region, such as a battery tab, a separator, or a particular region. This may be accomplished because the difference between the first and second results may contain signatures of specific failure modes. For example, as explained in greater detail below, when the DUT is a battery including conductive plates, a dip in the difference between the reactive impedances of the battery before and after applying a stress to the battery may be used to identify a thickness of the conductive plates. An abnormal determined thickness may then be used to identify a defect class. As another example, a slope of the difference in reactive impedances of the battery before and after applying a stress to the battery may be used to identify the presence of a torn tab in the battery. As yet another example, a bad tab weld may be identified when a signal-to-noise (SNR) ratio of the reactive impedance increases with increasing frequency of the driving voltage. Advantageously, each of these defect classes may be identified without performing measurements specific to the region of the DUT that is experiencing the defect (e.g., the reactive impedance measurements are performed on the DUT as a whole).

In some embodiments, a magnitude of the first defect is characterized based at least in part on the difference between the first and second results. For example, the size of the difference between the first and second results may be proportional to the magnitude of the first defect, or there may be a more complex (e.g., non-linear) relationship between the difference between the two results and the magnitude of the first defect.

In some embodiments, the first measurement may be taken when tab welding is complete, and the second measurement may be taken when the DUT arrives at the bagging station. Accordingly, in this example the first operation is the transportation of the DUT to the bagging station, it may be detected whether any damage has occurred in between the two manufacturing steps, by setting pass/fail criteria based on the difference between the two measurements.

In some embodiments, a particular region of the DUT is heated or cooled prior to performing the first measurement, the first operation, and the second measurement. In these embodiments, the defect class may be characterized further based on the heating or cooling of the particular region. The heating or cooling may be used to expand or contract a particular region of the DUT, or to accelerate or slow an electrochemical process in a particular region of the DUT. This controlled regional heating may be used to probe defects in particular areas of the DUT, as one example.

In some embodiments, characterizing the first defect class for the DUT utilizes a machine learning algorithm to map the difference between the first and second results to different ones of the plurality of defect classes. For example, in some embodiments a machine learning model is trained to learn the distribution of eddy currents that would result in a healthy DUT from a particular stimulus signal. In these embodiments, the first and second measurements may measure eddy currents in the DUT before and after applying the stimulus signal, and a deviation of the measured eddy currents from the behavior predicted by the model may be used to identify a defect class. In this example, the first operation may include driving the eddy currents.

In some embodiments, the DUT is a battery. In some embodiments, the battery is composed of a plurality of conductive plates. In these embodiments, the first and second measurements may involve applying an alternating current (AC) voltage with a frequency sweep to the DUT and measuring a first and second reactive impedance of the DUT, respectively. In these embodiments, the first and second results describe the reactive impedance of the DUT as a function of frequency, before and after performing the first operation. In these embodiments, the difference between the first and second reactive impedances of the DUT as a function of frequency is used to determine the defect class.

In some embodiments that determine a difference in reactive impedance as a function of frequency, characterizing the first defect class for the DUT may include identifying a first frequency that causes a dip in difference in the first and second reactive impedances of the DUT, determining a thickness of the conductive plates based at least in part on the first frequency, and determining the first defect class based at least in part on the thickness of the conductive plates. For example, a determined thickness that is less than a first threshold or greater than a second threshold may be indicative of a defect in the conductive plates.

In some embodiments that determine a difference in reactive impedances as a function of frequency, characterizing the first defect class for the DUT includes identifying a slope of the difference in the first and second reactive impedances as a function of frequency, before and after performing the first operation. The first defect class may be determined to be a torn tab of the battery based at least in part on the slope. For example, a slope of this difference that is greater than a predetermined threshold may be indicative of a torn tab of the battery.

The signal-to-noise ratio (SNR) is a measure of the strength of a signal relative to the background noise in a system. In the context of a method that maximizes repeatability, a high SNR is desirable because it means that the signal being measured is strong and distinct, and is less likely to be affected by noise or other sources of error.

In some embodiments, the SNR for the first and second measurements has a frequency dependence that is a function of the defect mode. This fact may be utilized by performing the analysis at a single frequency (or a plurality of frequencies) that maximizes the SNR for a specific type of defect. For example, in the case of a bad tab weld, the SNR for measured reactive impedance generally increases with the excitation frequency. In practice, the optimal frequency may be different for the various signals and derived values, and the reactance impedance is just one example.

In some embodiments, characterizing the first defect class for the DUT involves determining that a signal-to-noise ratio (SNR) for reactive impedance of the DUT increases with excitation frequency, and determining that a bad tab weld occurred on the DUT based on the determination that the SNR for reactive impedance increases with excitation frequency. In some embodiments, this determination may be made based on either the first or second result exhibiting an SNR for reactive impedance that increases with frequency. Alternatively, in some embodiments the determination may be made based on an increase with frequency of the difference in the SNR for reactive impedance before and after applying the first operation on the DUT, where the first operation may be a manufacturing step of the DUT, controlled regional heating of the DUT, a physical actuation of the DUT, and/or an electrical actuation of the DUT, among other possibilities.

Additional Technical Description

The following numbered paragraphs described additional aspects of the described embodiments.

Figure 5:
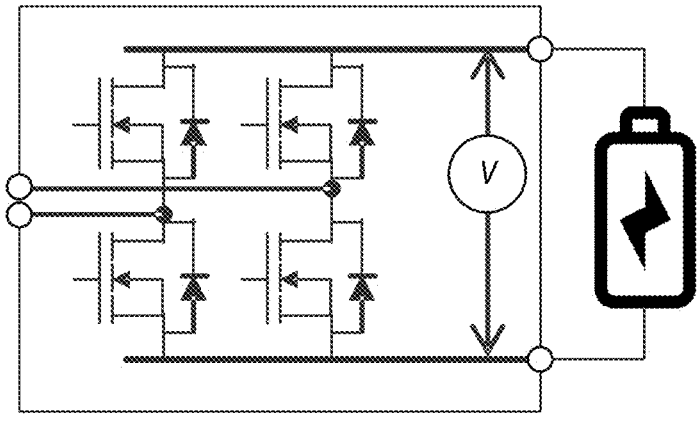
FIG. 5 is a schematic illustration of a cell formation setup, according to some embodiments.

FIG. 5—Cell Formation Setup

FIG. 5 is a circuit diagram illustrating an example setup for performing cell formation. The illustrated setup may be used, for example, while characterizing a defect class for the cell according to embodiments described herein.

Figure 6:
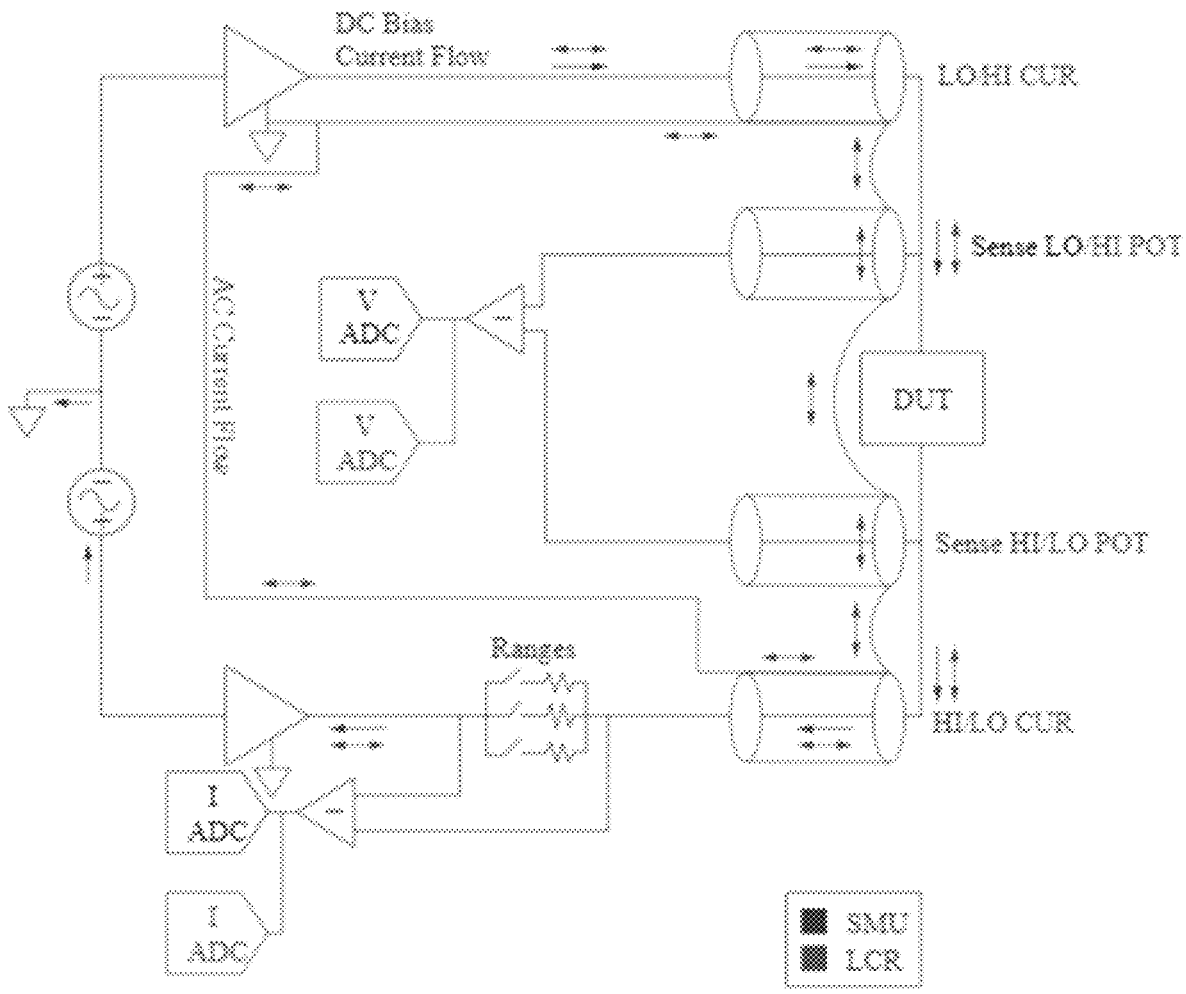
FIG. 6 is a circuit diagram illustrating a setup for characterizing a defect class of a DUT, according to some embodiments.

FIG. 6—Circuit Diagram for Defect Class Characterization

FIG. 6 is a circuit diagram illustrating a setup for characterizing a defect class of a DUT, according to some embodiments. The illustrated circuit may be used, for example, for performing the first and second measurements on the DUT and/or for performing the first operation on the DUT. Other circuits for interfacing with the DUT may also be used, as desired.

Figure 7:
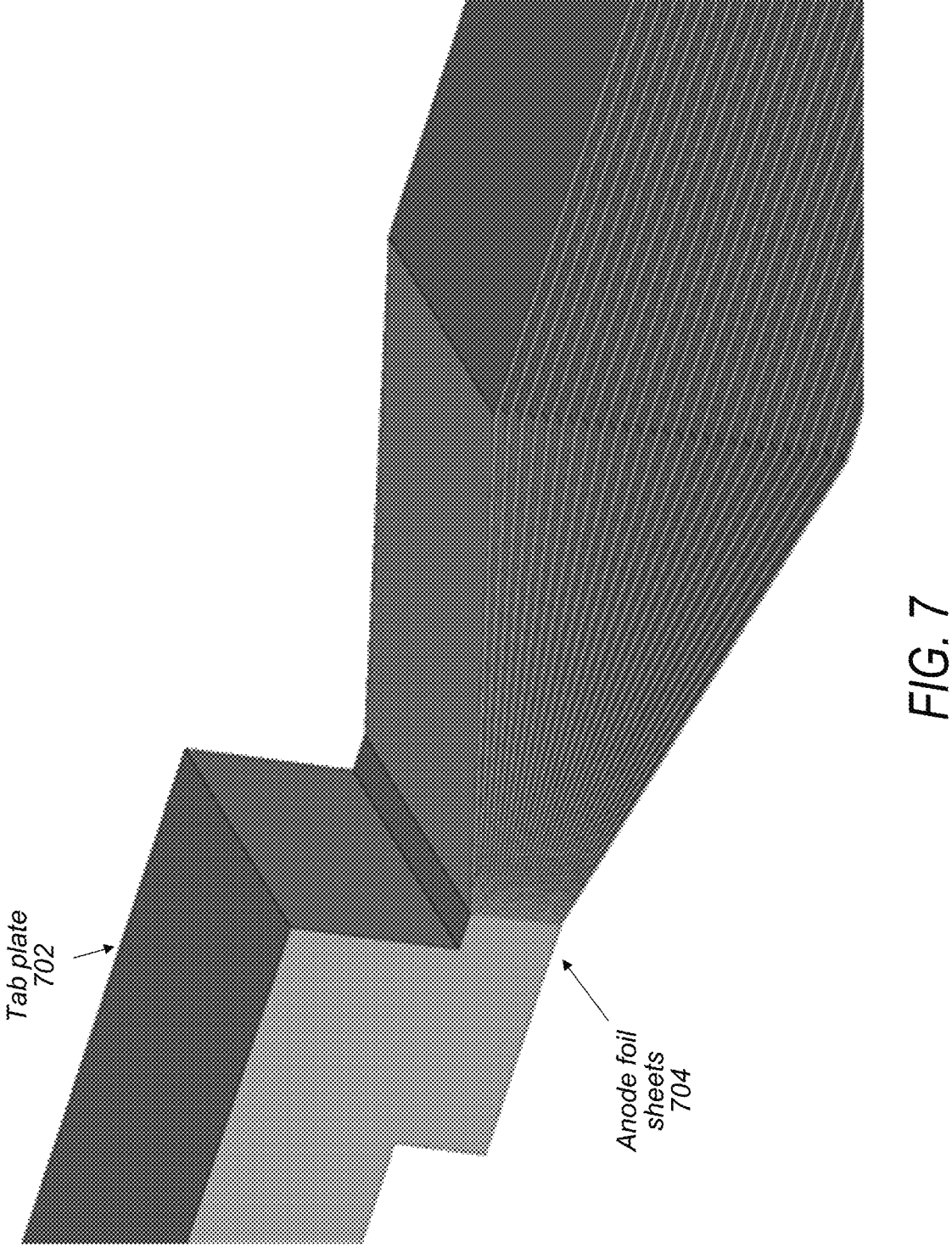
FIG. 7 illustrates an example architecture for a battery cell illustrating a tab plate attached to anode foil sheet, according to some embodiments.

FIG. 7—Battery Cell Architecture

FIG. 7 illustrates an example architecture for a portion of a battery cell, according to some embodiments. The illustrated detail of the battery cell shows structural regions near the end of a pouch cell. As illustrated, a tab plate 702 is attached to a stack of aluminum anode foil sheets 704. The tab plate and the anode foil sheets are pressed and welded together. The foil sheets then fan out at an angle before continuing in a straight line along the length of the pouch cell. In FIG. 7, only the aluminum electrode sheets are shown. Embodiments herein describe methods and devices for identifying the presence of a defective weld between the tab plate and the anode foil sheets, as one example.

Electrochemical Process Manifold for Battery Cell Formation

Figure 8:
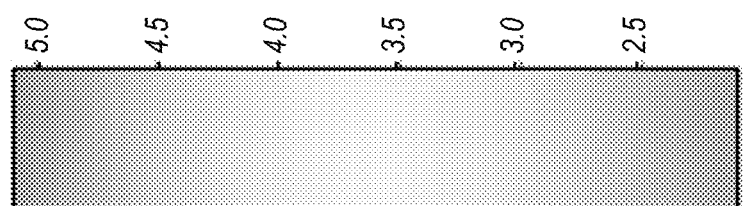
FIG. 8 illustrates an example of a displayed Electrochemical Process Manifold (EPM), according to some embodiments.

In some embodiments, an electrochemical process manifold (EPM) is constructed for an electrochemical process and system (such as a battery cell) during the cell formation process. The EPM is a detailed construct that contains state-space mapping for a plurality of variables associated with the cell such as current, voltage, temperature, and/or pressure. An example of a display of an EPM is shown in FIG. 8, where the illustrated EPM has three axes for voltage, charge and current for the battery cell.

As used herein, "manifold" refers to the mathematical construct of an n-dimensional topological space, where each of the n dimensions corresponds to a state variable of the cell (e.g., current, voltage temperature, etc.). An EPM then encodes relational information of the state-history of a cell as regards the relevant variables. For example, the EPM describes a topological space whose points describe the state history of the recorded variables of the cell. Advantageously, the mathematical properties of manifolds may be leveraged to facilitate analysis of the EPM to diagnose the health of a cell. For example, the EPM may be used diagnostically to identify faulty cells earlier in the formation process, and may also be used to dynamically modify cell formation to improve yields. Various properties of the EPM (e.g., curvature, area, metric quantities, etc.) may be quantified to diagnose aspects of the cell. For example, deviation a one or more properties from those of an EPM of a reference healthy cell may be measured and quantified to diagnose the health of a cell.

In various embodiments, either the current may be directly controlled (and voltage is periodically measured), or the voltage may be directly controlled (and current is periodically measured). In some embodiments, for 'current control mode' temperature and pressure may be controlled in addition to controlling current, so voltage is the dependent variable. Similarly, in some embodiments, for 'voltage control mode' temperature and pressure may be controlled in addition to voltage and current is the dependent variable. However, in some embodiments satisfactory but less information-rich EPMs may be obtained with less effort if temperature and pressure are uncontrolled and/or unmeasured. In some embodiments, temperature and pressure are controlled such that they oscillate at the same frequency as the current for current control mode, or the same frequency as voltage for voltage control mode. Advantageously, this may enable an easier calculation of the phase relationship between the variables which yields more information about the electrochemical processes.

In some embodiments, the phase angle of the voltage is computed relative to the phase angle of the controlled current and other variables. This is a coordinate transformation from the time domain to a rotating reference frame aligned with the other signal (for example, the current phasor.) Each value (i.e., voltage, temperature, pressure) sampled in the time domain may be described in terms of its amplitude and also its phase angle relative to the other variables, and this phase angle relationship yields valuable information about the electrochemical process and therefore helps in constructing a more information-rich EPM. As an example, an oscillatory variation in temperature produces an oscillatory voltage response and the nature of the voltage response contains information about the electrochemical processes that are currently underway. To keep the phase angle calculations simpler, the cell temperature may be varied at the same frequency as the electrical control variable (current in the case of current control or voltage in the case of voltage control). Various methods may be used to compute the relative phase angles and to control the temperature phase angle. To include phase information in a compact numerical form, each transformed variable can be expressed as a vector, such as a complex number or a higher dimensional vector in the EPM subspace (i.e., for each location on the EPM mesh-grid, compute each of: the component of voltage that is parallel to temperature, the component of voltage that is orthogonal to temperature, the component of voltage that is parallel to current, the component of voltage that is orthogonal to current, etc.). Mathematically, the time domain data is mapped onto the electrochemical process manifold, because manifolds have well defined mathematical properties that facilitate interpretation and analysis.

In various embodiments, different processes are implemented to map the time-series data points (i.e., the sequence of data points that each include a time stamp, current value, voltage value, current-hours value, voltage-hours value, etc.) onto the EPM. For example, in some embodiments a conventional method is utilized where, for each set of data sampled in the time domain ("set" here refers to simultaneously sampled voltage, voltage_hours, current, current_hours, etc.), identify the nearest grid point on the N-dimensional EPM mesh-grid and perform data aggregation to update the mesh-grid value at that location with the mean value of all samples that are closest to the mesh-grid location in N-dimensional space. This is a coordinate transformation to a discrete manifold with averaging of the time domain data. Doing this is a form of data compression, since the values for each location in the discrete manifold are the average of all time domain samples within range. Thus, we have the option to discard the time-series data and only store the dense manifold values. An ideal EPM Scanner algorithm ensures we collect at least S samples for each location in the EPM mesh-grid, where $S \geq 1$.

In other embodiments, a machine learning method may be used to map the time-series data points to the EPM. Based on prior knowledge of many EPM mesh-grids for complete electrochemical processes, the most likely mesh-grid may be identified that explains one or more sets of data sampled in the time domain, optionally given incomplete time series data. This has the desirable properties of the conventional method such as coordinate transformation and data compression, but adds important additional benefits such as 1) the ability to perform intelligent non-linear interpolation between unsampled data points in the EPM mesh-grid given a priori knowledge of many EPMs, and 2) the ability to predict the EPM for an entire electrochemical process before that process has been completed. In this case, the confidence level in the EPM prediction increases with time and reaches 100 percent at the completion of the electrochemical process.

EPMs may enable direct modelling of electrochemical processes for different variables as a function of time. EPMs may also model how electrochemical processes may proceed depending on the presence of specific defect modes. The time evolution of defects in the battery cell may then be predicted. It may then be determined whether defects are increasing in value, which may lead to a dangerous or destructive situation for batteries such as a fire explosion, runaway thermal event, and so on.

Similarly, an EPM may be used to anticipate whether the defect phenomena is likely to decay over time in a stable way. In this case, the defect may dissipate or at least not result in a runaway failure.

Advantageously, these methods may enable the identification of defects that are representative of grave threats to the future structural safety of the cell such as those could lead to a thermal runaway event as contrasted with other effects which are less malfeasant in their nature such as an effect that merely would degrade the performance of the cell and perhaps change it from a grade A cell to a grade B cell.

Figure 9:
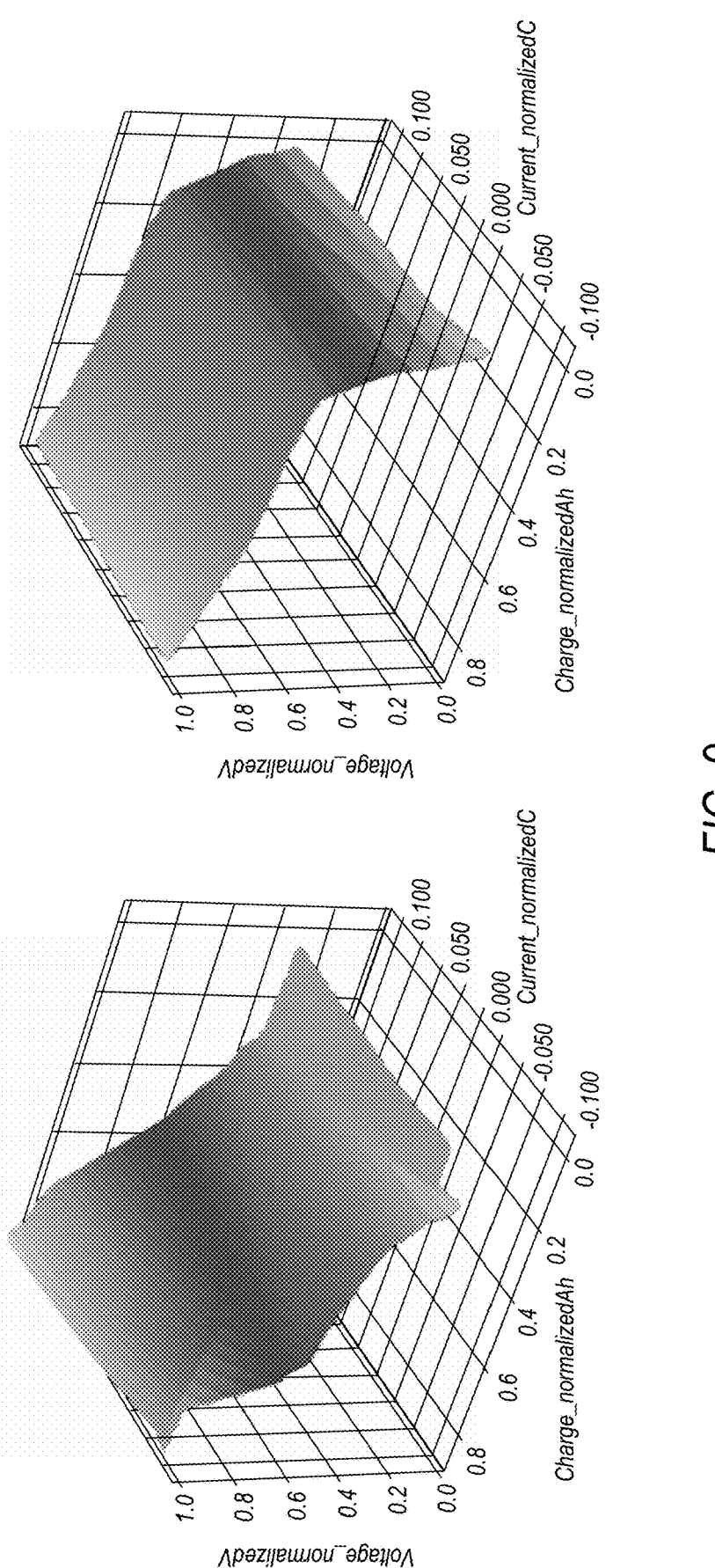
FIG. 9 illustrates two different EPMs constructed before and after performing an operation on a DUT, according to some embodiments.

In some embodiments, and EPM may be calculated for a cell both before and after performing an operation on the cell (e.g., applying a mechanical stress, an electrochemical actuation, heating, or cooling, among other possibilities). An example of this is shown in FIG. 9, where the EPM shown on the left is calculated before applying an operation, whereas the EPM shown on the right is calculated after performing the operation. The discrepancy between the two EPMs may be used to diagnose a defect class for the cell, depending on the specific operation performed and the nature of the discrepancy between the two EPMs.

Differentiating Inactive and Active Material Response

In some embodiments, the portion of the measured electrical effects resulting from active material of the battery cell may be distinguished from the effects resulting from inactive electrical conductors such as the electrodes, which are typically composed of aluminum and copper sheets or foils. In this way, described embodiments may be able to discern the difference between the electrical stimuli associated with the active material and the electrical stimuli associated with the metallic conductors, sheets, foils, tabs, and other highly conductive elements.

These highly conductive metallic elements may be characterized by their magnetic and electrical responses in terms of their electrical conductivity and their magnetic permeability relative to that of free space.

These materials may have structural properties that occur at specific frequencies and/or over specific ranges of frequencies. These frequencies may provide a useful way to discern the response of active material compared and contrasted with the response of inactive material in the battery cell. For example, the inactive conductive metals may exhibit responses primarily at higher frequencies, whereas the electrical response characteristics associated with active material may occur at lower ranges of frequencies such as 0 to 20 kHz, or 0 to 50 kHz, or 0 to 100 kHz, depending on the nature of the cell.

If we are interested in interrogating the structural defects associated with the metallic conducting regions of the cell, frequencies above the dominant response frequencies of the active material may be probed. The lower frequency effects including DC are greatly influenced by the energy storage effects of lithium ions that can move spatially within the structure, as well as the electrons, which are best understood in terms of their electromagnetic fields.

Inducing Eddy Currents to Characterize Defects

In some embodiments, a single tone sinusoidal current is applied to the battery cell to induce AC currents and eddy currents at a controlled depth in the axis perpendicular to the electrode foils of the anode and cathode. This may selectively scan the foils in terms of structural depth. By applying an AC current to the battery cell, AC currents and eddy currents may be induced that may be used to scan the electrodes in terms of structural depth. The AC current will penetrate to a certain depth in the electrodes, depending on the frequency of the current and the properties of the electrodes.

In some embodiments, different frequencies may be used to selectively scan different depths in the electrodes. This may be useful for studying the structure of the electrodes and detecting any defects or irregularities that may be present.

The depth of penetration of the AC current may depend on the electrical conductivity and magnetic permeability of the electrodes, as well as the frequency of the current. By using the equations for skin depth and eddy current losses, the expected depth of penetration may be calculated for a given set of conditions.

Correlated and Uncorrelated Sources of Error

Correlated sources of error refer to errors that are related or linked to one another in some way. This means that correlated errors tend to occur in a systematic or predictable manner, and are not random or independent of each other. Correlated errors may be caused by factors such as systematic biases in the measurement process, equipment that is not calibrated correctly, or environmental conditions that affect the measurements, among other possibilities.

Uncorrelated sources of error, on the other hand, refer to errors that are not related to one another and are random or independent. These errors are not systematic or predictable and may be caused by factors such as random fluctuations in the measurement process, measurement noise, or sampling error.

Correlated errors are generally more predictable and easier to identify than uncorrelated errors, as they tend to occur in a systematic manner. Uncorrelated errors, on the other hand, are more random and harder to predict. In addition, correlated errors may have a larger impact on the accuracy of measurements than uncorrelated errors, as they tend to be more consistent and can affect multiple measurements in the same way. Uncorrelated errors, on the other hand, are more random and are less likely to affect the accuracy of measurements in a consistent manner. Correlated errors may often be corrected more effectively than uncorrelated errors, as they are more predictable and may be identified and compensated for more easily. Uncorrelated errors are more difficult to correct, as they are more random and harder to predict.

Distinguishing Eddy Current and Hysteresis Losses

In some embodiments, properties of eddy current losses may be used to separate them from other types of losses, such as hysteresis losses. In particular, eddy current losses tend to increase in proportion to the square of the frequency of the applied current, where hysteresis losses tend to increase as a linear function of frequency. This difference in frequency dependence may be used to distinguish between these two types of losses. Likewise, some defect modes occur as a linear function of frequency, such as the structural magnitude of tab tears. Tab tears may cause air gaps with a permeability similar to free space. The structural defects that cause these types of losses tend to be more related to the geometry of the conducting material, rather than its electrical properties. In contrast, the distribution of losses in the plane of the anode and cathode foils scales with the square of the frequency, as is the amplitude of the heat losses associated with eddy currents. This is because eddy current losses are related to the electrical conductivity and resistivity of the material, which tend to exhibit a quadratic frequency dependence.

Distinguishing Torn Tabs, Bad Tab Welds, and Dendrites

Mechanically, if a tear is present in a component of a battery cell, a force may be introduced that is aligned with the direction of greatest leverage for increasing the tear or decreasing the tear. Accordingly, a measurement (e.g., of impedance or of another quantity) may be performed before and after applying the force, and the difference between the two measurements may be used to determine whether a tear is likely present (e.g., a difference greater than a predetermined threshold may be indicative of a torn tab).

Torn tabs is one example of a specific defect that may be differentially exacerbated, so as to discern the difference between it and another defect mode, such as the presence of a dendrite that is poking into the separator polymer.

A dendrite is a branching, tree-like crystal structure that may form in a battery cell over time. Dendrites are typically made of the same material as the electrodes in the battery cell and may grow from one electrode to the other, causing a short circuit and potentially leading to the failure of the battery cell.

In lithium-ion batteries, dendrites may form on the surface of the lithium metal anode during charging and discharging cycles. These dendrites may grow and extend through the separator that is meant to keep the anode and cathode electrodes separate, ultimately reaching the cathode and causing a short circuit. Dendrite formation is one of the main factors that can limit the lifetime and performance of lithium-ion batteries.

Dendrites are typically made of lithium and may have a needle-like or tree-like structure. They are usually very thin, with diameters of just a few micrometers, and may grow very quickly, sometimes reaching several centimeters in length within just a few charging and discharging cycles.

The structural nature of dendrites is highly dependent on the material they are made of, the conditions in the battery cell, and the charging and discharging cycles that the battery cell undergoes.

Some embodiments determine whether a poorly done tab weld has occurred, where an ultrasonic or laser weld did not perform correctly and the two materials are thereby not fully welded together as desired. A mechanical stress or strain may be applied on a specific region. A mechanical strain is thereby exerted that would exacerbate a poor weld while simultaneously performing the required measurements and analysis to assess the severity of the defect or assess the confidence level in this area of the defect.

In some embodiments, the described methods may be performed by a standard computer processor coupled to memory. Alternatively, in some embodiments a programmable hardware element may be utilized to perform the described methods. A programmable hardware element may include various hardware devices comprising multiple programmable function blocks connected via a programmable interconnect. Examples include FPGAs (Field Programmable Gate Arrays), PLDs (Programmable Logic Devices), FPOAs (Field Programmable Object Arrays) and CPLDs (Complex PLDs). The programmable function blocks may range from fine grained (combinatorial logic or look up tables) to coarse grained (arithmetic logic units, graphics processing units (GPUs), or processor cores). A programmable hardware element may also be referred to as "reconfigurable logic." As another option, an integrated circuit with dedicated hardware components such as an Application Specific Integrated Circuit (ASIC) may be used to perform the described method steps.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for characterizing a defect of a device-under-test (DUT), the method comprising:

performing a first measurement of a first quantity on the DUT prior to performing a first operation on the DUT, wherein performing the first measurement produces a first result;

performing the first operation on the DUT;

after performing the first operation on the DUT, performing a second measurement of the first quantity on the DUT, wherein performing the second measurement produces a second result;

characterizing a first defect class for the DUT from a plurality of defect classes based at least in part on a difference between the first and second results, wherein the plurality of defect classes comprise defects in different regions of the DUT.

2. The method of claim 1, wherein the first defect class indicates a defect in a first region of the DUT, and wherein the first and second measurements are not specific to the first region of the DUT.

3. The method of claim 1, further comprising:

characterizing a magnitude of the first defect based at least in part on the difference between the first and second results.

4. The method of claim 1, further comprising:

heating or cooling a first region of the DUT prior to performing the first measurement, the first operation, and the second measurement;

wherein characterizing the defect class is performed further based in part on the heating or cooling of the first region.

5. The method of claim 1, wherein characterizing the first defect class for the DUT utilizes a machine learning algorithm to map the difference between the first and second results to different ones of the plurality of defect classes.

6. The method of claim 1, further comprising:

determining the first and second measurements based at least in part on a structure of the DUT.

7. The method of claim 1, wherein the DUT comprises a battery comprising a plurality of conductive plates, wherein the first and second measurements comprise applying an alternating current (AC) voltage with a frequency sweep to the DUT and measuring a first and second reactive impedance of the DUT, respectively, wherein the difference between the first and second results comprises a difference in the first and second reactive impedances of the DUT as a function of frequency;

wherein characterizing the first defect class for the DUT comprises:

identifying a first frequency that causes a dip in difference in the first and second reactive impedances of the DUT;

determining a thickness of the conductive plates based at least in part on the first frequency; and determining the first defect class based at least in part on the thickness of the conductive plates.

8. The method of claim 1, wherein the DUT comprises a battery, wherein the first and second measurements comprise applying an alternating current (AC) voltage with a frequency sweep to the DUT and measuring a first and second reactive impedance of the DUT, respectively, wherein the difference between the first and second results comprises a difference in the first and second reactive impedances of the DUT as a function of frequency;

wherein characterizing the first defect class for the DUT comprises:

identifying a first slope of the difference in the first and second reactive impedances of the DUT as the function of frequency; and determining the first defect class to be a torn tab of the battery based at least in part on the first slope.

9. The method of claim 1, further comprising:

wherein characterizing the first defect class for the DUT comprises:

determining that a signal-to-noise ratio (SNR) for reactive impedance of the DUT increases with excitation frequency; and determining that a bad tab weld occurred on the DUT based on the determination that the SNR for reactive impedance increases with excitation frequency.

10. The method of claim 1, wherein the first operation comprises one or more of:

a manufacturing step of the DUT;

controlled regional heating of the DUT;

a physical actuation of the DUT; or an electrical actuation of the DUT.

11. The method of claim 1, wherein the plurality of defect classes comprises two or more of:

a weld defect;

a bad tab weld;

a torn tab;

a folded separator;

a dendrite;

an internal short;

internal contamination; and wetting.

12. A controller, comprising:

a non-transitory computer-readable memory medium; and a processor coupled to memory medium, wherein the processor is configured to execute program instructions stored on the memory medium to cause the controller to:

perform a first measurement of a first quantity on a device-under-test (DUT) prior to performing a first operation on the DUT, wherein performing the first measurement produces a first result;

perform the first operation on the DUT;

after performing the first operation on the DUT, perform a second measurement of the first quantity on the DUT, wherein performing the second measurement produces a second result; and characterize a first defect class for the DUT from a plurality of defect classes based at least in part on a difference between the first and second results, wherein the plurality of defect classes comprise defects in different regions of the DUT.

13. The controller of claim 12, wherein the first defect class indicates a defect in a first region of the DUT, and wherein the first and second measurements are not specific to the first region of the DUT.

14. The controller of claim 12, wherein the program instructions are further executable to cause the controller to:

heat or cool a first region of the DUT prior to performing the first measurement, the first operation, and the second measurement;

wherein characterizing the defect class is performed further based in part on the heating or cooling of the first region.

15. The controller of claim 12, wherein the DUT comprises a battery comprising a plurality of conductive plates, wherein the first and second measurements comprise applying an alternating current (AC) voltage with a frequency sweep to the DUT and measuring a first and second reactive impedance of the DUT, respectively, wherein the difference between the first and second results comprises a difference in the first and second reactive impedances of the DUT as a function of frequency;

wherein, in characterizing the first defect class for the DUT, the program instructions are further executable to cause the controller to:

identify a first frequency that causes a dip in difference in the first and second reactive impedances of the DUT;

determine a thickness of the conductive plates based at least in part on the first frequency; and determine the first defect class based at least in part on the thickness of the conductive plates.

16. The controller of claim 12, wherein the DUT comprises a battery, wherein the first and second measurements comprise applying an alternating current (AC) voltage with a frequency sweep to the DUT and measuring a first and second reactive impedance of the DUT, respectively, wherein the difference between the first and second results comprises a difference in the first and second reactive impedances of the DUT as a function of frequency;

wherein, in characterizing the first defect class for the DUT, the program instructions are further executable to cause the controller to:

identify a first slope of the difference in the first and second reactive impedances of the DUT as the function of frequency; and determine the first defect class to be a torn tab of the battery based at least in part on the first slope.

17. The controller of claim 12, wherein the processor comprises one of:

a parallel multi-processor system;

a field programmable gate array (FPGA); or an application specific integrated circuit (ASIC).

18. A non-transitory computer-readable memory medium storing program instructions which, when executed by at least one processor, cause the at least one processor to:

perform a first measurement of a first quantity on a device-under-test (DUT) prior to performing a first operation on the DUT, wherein performing the first measurement produces a first result;

perform the first operation on the DUT;

after performing the first operation on the DUT, perform a second measurement of the first quantity on the DUT, wherein performing the second measurement produces a second result; and characterize a first defect class for the DUT from a plurality of defect classes based at least in part on a difference between the first and second results, wherein the plurality of defect classes comprise defects in different regions of the DUT.

19. The non-transitory computer-readable memory medium of claim 18, wherein the first defect class indicates a defect in a first region of the DUT, and wherein the first and second measurements are not specific to the first region of the DUT.

20. The non-transitory computer-readable memory medium of claim 18, wherein the DUT comprises a battery, wherein the first and second measurements comprise applying an alternating current (AC) voltage with a frequency sweep to the DUT and measuring a first and second reactive impedance of the DUT, respectively, wherein the difference between the first and second results comprises a difference in the first and second reactive impedances of the DUT as a function of frequency;

wherein, in characterizing the first defect class for the DUT, the program instructions are further executable to cause the at least one processor to:

identify a first slope of the difference in the first and second reactive impedances of the DUT as the function of frequency; and determine the first defect class to be a torn tab of the battery based at least in part on the first slope.

\* \* \* \* \*